United States Patent
Oh et al.

(10) Patent No.: US 6,642,125 B2
(45) Date of Patent: Nov. 4, 2003

(54) INTEGRATED CIRCUITS HAVING ADJACENT P-TYPE DOPED REGIONS HAVING SHALLOW TRENCH ISOLATION STRUCTURES WITHOUT LINER LAYERS THEREIN THEREBETWEEN AND METHODS OF FORMING SAME

(75) Inventors: Yong-chul Oh, Kyungki-do (KR); Gyo-young Jin, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/021,165

(22) Filed: Dec. 7, 2001

(65) Prior Publication Data

US 2002/0070420 A1 Jun. 13, 2002

(30) Foreign Application Priority Data

Dec. 9, 2000 (KR) .......................................... 2000-74915

(51) Int. Cl.[7] .............................................. H01L 21/76
(52) U.S. Cl. ...................................... 438/427; 438/424
(58) Field of Search .................................. 257/506–510, 257/296–310; 438/224–227, 424–437, 243–254

(56) References Cited

U.S. PATENT DOCUMENTS 5,940,717 A    8/1999  Rengarajan et al.
6,468,849 B1 * 10/2002  Efland et al. ............... 438/200

FOREIGN PATENT DOCUMENTS

KR    P2000-0009808    2/2000

* cited by examiner

Primary Examiner—Cuong Quang Nguyen
(74) Attorney, Agent, or Firm—Myers Bigel Sibley & Sajovec

(57) ABSTRACT

An integrated circuit substrate includes first and second adjacent p-type doped regions spaced-apart from one another. A trench in the integrated circuit substrate is between the first and second adjacent p-type doped regions. An insulator layer in the trench has a side wall, wherein the side wall is free of a layer that reduces a stress between the integrated circuit substrate and the insulator layer.

22 Claims, 5 Drawing Sheets

INTEGRATED CIRCUITS HAVING ADJACENT P-TYPE DOPED REGIONS HAVING SHALLOW TRENCH ISOLATION STRUCTURES WITHOUT LINER LAYERS THEREIN THEREBETWEEN AND METHODS OF FORMING SAME

CLAIM FOR PRIORITY

This application claims priority to Korean Patent Application No. 2000-74915, filed on Dec. 9, 2000, the entire disclosure of which is incorporated herein by reference.

FIELD OF THE INVENTION

The present invention relates to integrated circuits and methods of forming integrated circuits in general and, more particularly, to shallow trench isolation structures in integrated circuits and methods of forming shallow trench isolation structures in integrated circuits.

BACKGROUND OF THE INVENTION

With the development of semiconductor manufacturing techniques, progress has been made in increasing the speed and integration of semiconductor devices. Local Oxidation Of Silicon (LOCOS) layers have been used as isolation layers in semiconductor devices. However, LOCOS may promote a bird's beak effect at the edges of the isolation layer thus reducing the size of the adjacent active regions and which may adversely affect current leakage.

Referring to FIG. 1, a semiconductor substrate 10 includes as a cell region, a core region and a peripheral region. A blocking pattern (not shown) is formed on the semiconductor substrate 10 to expose an isolation region. The blocking pattern may be a stack of an oxide layer and a silicon nitride layer. The exposed semiconductor substrate 10 is etched to a depth using the blocking pattern as a mask to form trenches $t_1$ and $t_2$. The trench $t_1$ is formed in the cell region and the trench $t_2$ is used to define a PMOS transistor region in the core and peripheral regions. The trenches $t_1$ and $t_2$ can be formed by dry etching using plasma.

The dry etching may cause silicon lattice defects and damage the inner surfaces of the trenches $t_1$ and $t_2$. Conventionally, to reduce such silicon lattice defects and damage, a side wall oxide layer 12 can be formed by thermally oxidizing the inner surfaces of the trenches $t_1$ and $t_2$. Also, the formation of the side wall oxide layer 12 can remove sharp corners generated in the trenches $t_1$ and $t_2$ associated with the bird's beak effect discussed above.

Subsequently, a silicon nitride liner 14 can be formed on the side wall oxide layer 12. The silicon nitride liner 14 may reduce stress due to a difference between the respective thermal expansion coefficients associated with the semiconductor substrate 10 and a silicon oxide layer in the trenches $t_1$ and $t_2$.

A dielectric material, such as a High Density Plasma (HDP) oxide, is deposited on the semiconductor substrate 10 to completely fill the trenches $t_1$ and $t_2$. Next, a Chemical Mechanical Polishing (CMP) process is performed on the HDP oxide and the blocking pattern to expose a surface of the semiconductor substrate 10 to form an STI layer 16 in the trenches $t_1$ and $t_2$ which completes the conventional STI structure.

However, the semiconductor device having the conventional STI structure discussed above may cause the following problems. With reference to FIGS. 2A and 2B, high energy or "hot" carriers in a MOS transistor can penetrate through the side wall oxide layer 12 into the STI layer 16. N-type charged carriers, such as electrons 30, that penetrate into the STI layer 16 may collect at an interface of the silicon nitride liner 14 and the side wall oxide layer 12 and in the silicon nitride liner 14 as shown in FIG. 2A. The electrons 30 may be trapped at the interface due the thickness of the side wall oxide layer 12. When a dense region of the electrons 30 collects at the interface, positive holes 32 can be induced at a boundary of the STI layer 16 opposite the electrons 30 as shown in FIG. 2A.

As shown in FIG. 2B, a conductive path through the semiconductor substrate 10 may not be formed between n-type junction regions 26a and 26b of an N-channel field effect transistor (N-FET) because the major carriers are electrons 30. However, the holes 32 at the boundary of the STI layer 16 can provide a current path I that electrically connects a p-type junction region 28a (associated with a gate electrode of a Metal Oxide Semiconductor (MOSFET) 24) and 28b associated with an adjacent MOSFET. Although the STI structure is located between the p-type junction regions 28a and 28b, the leakage current can be increased by the current path I which can cause, for example, increased standby current after burn-in of the integrated circuit.

Furthermore, in cases where a channel region of the P-FET is adjacent to the silicon nitride liner 14 where the electrons 30 are trapped, holes may be induced in the channel region of the P-FET thereby affecting the operation of the P-FET. Also, holes induced when the P-FET is turned on may not be easily removed and, therefore, may remain after the P-FET is turned off. The length of the channel of the P-FET may, therefore, be reduced which may decrease the threshold and breakdown voltages associated with the P-FET.

SUMMARY OF THE INVENTION

Embodiments according to the present invention may provide integrated circuits having Shallow Trench Isolation (STI) structures. Pursuant to these embodiments, an integrated circuit substrate can include first and second adjacent p-type doped regions spaced-apart from one another in the integrated circuit substrate. A trench in the integrated circuit substrate is between the first and second adjacent p-type doped regions. An insulator layer in the trench has a side wall, wherein the side wall is free of a layer thereon that reduces a stress between the integrated circuit substrate and the insulator layer.

In some embodiments according to the present invention, a dielectric material is in the trench directly on the side wall. In some embodiments according to the present invention, the trench is a first trench and the side wall is a first side wall and the insulator layer is a first insulator layer. First and second adjacent n-type doped regions are spaced-apart from one another in the integrated circuit substrate. A second trench is in the integrated circuit substrate between the first and second adjacent n-type doped regions. A second insulator layer in the second trench has a second side wall. A liner layer on the second side wall can reduce a stress between the integrated circuit substrate and the second insulator layer.

In some embodiments according to the present invention, the dielectric material is a first dielectric material and a second dielectric material is in the second trench on the liner layer. In some embodiments according to the present invention, the side wall is free of silicon nitride. In some embodiments according to the present invention, the integrated circuit includes a core region, a peripheral region, and a cell region that is spaced apart from the core and peripheral regions and has a greater density of integrated circuit devices therein than the core and peripheral regions, wherein the first trench is in one of the peripheral and core regions. The second trench is in the cell region.

In some embodiments according to the present invention, the integrated circuit includes a core region, a peripheral region, and a cell region that is spaced apart from the core and peripheral regions and has a greater density of integrated circuit devices therein than the core and peripheral regions. The trench is between the core and peripheral regions and the cell region.

In some embodiments according to the present invention, the integrated circuit includes a core region, a peripheral region, and a cell region that is spaced apart from the core and peripheral regions and has a greater density of integrated circuit devices therein than the core and peripheral regions. The trench is in one of the core and peripheral regions.

Pursuant to method embodiments according to the present invention, first and second adjacent p-type doped regions are formed spaced-apart from one another in an integrated circuit substrate. A trench is formed in the integrated circuit substrate between the first and second adjacent p-type doped regions. An insulator layer is formed in the trench having a side wall, wherein the side wall is free of a layer that reduces a stress between the integrated circuit substrate and the insulator layer.

DETAILED DESCRIPTION OF EMBODIMENTS ACCORDING TO THE INVENTION

Figure 1:
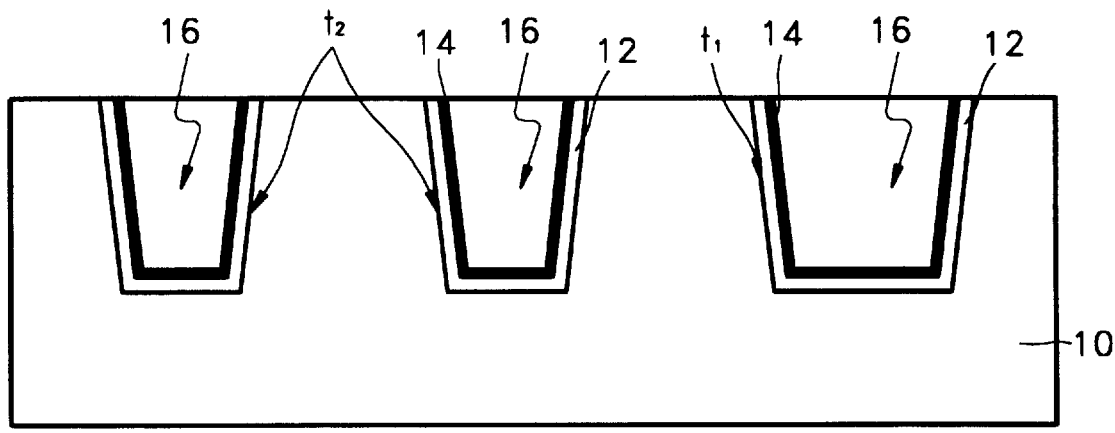
FIG. 1 is a cross-sectional view of a semiconductor device having a conventional STI structure therein.
Figure 2A:
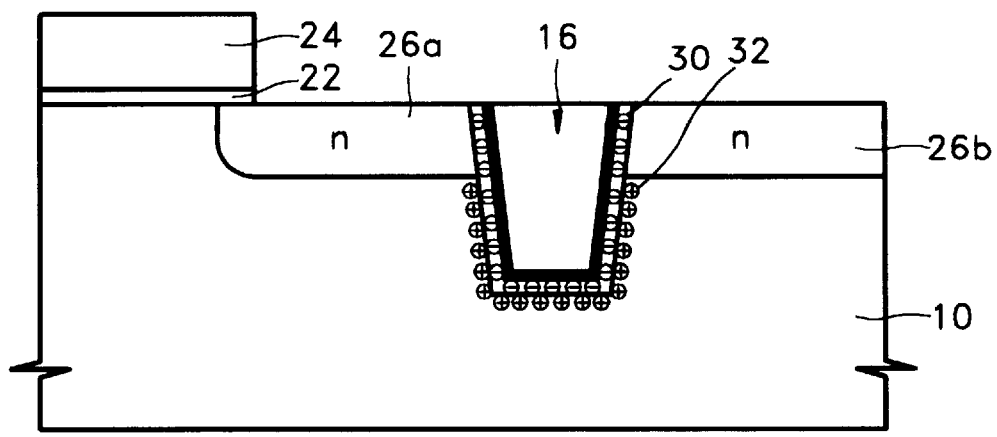
FIG. 2A is a cross-sectional view illustrating an NMOS transistor adjacent to an n-type region having a conventional STI structure therebetween.
Figure 2B:
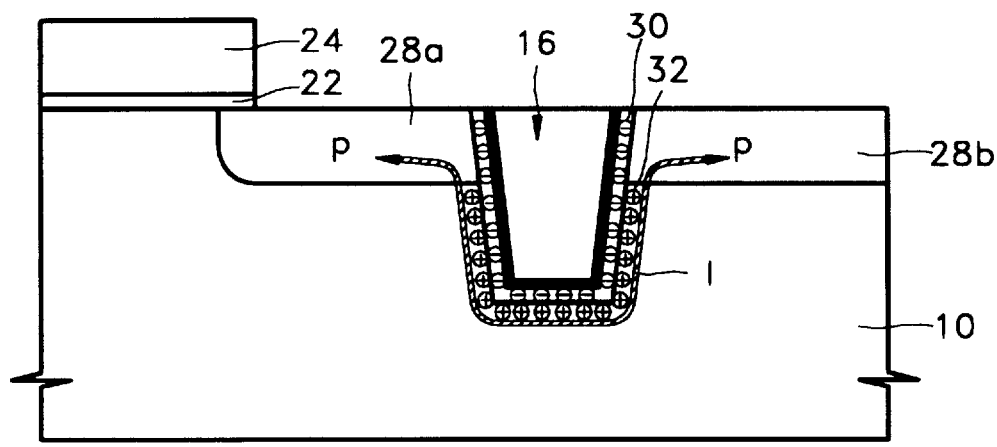
FIG. 2B is a cross-sectional view illustrating a PMOS transistor adjacent to an p-type region having a conventional STI structure therebetween.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

In the drawings, the thickness of layers and regions are exaggerated for clarity. It will be understood that when an element such as a layer, region or substrate is referred to as being "on" another element, it can be directly on the other element or intervening elements may also be present. When an element is disclosed as being "directly on" another element, no intervening elements are present. Although embodiments according to the present invention are disclosed herein with reference to semiconductor substrates, it will be understood that embodiments according to the present invention may utilize any type of integrated circuit substrate. Like numbers refer to like elements throughout.

Figure 3A:
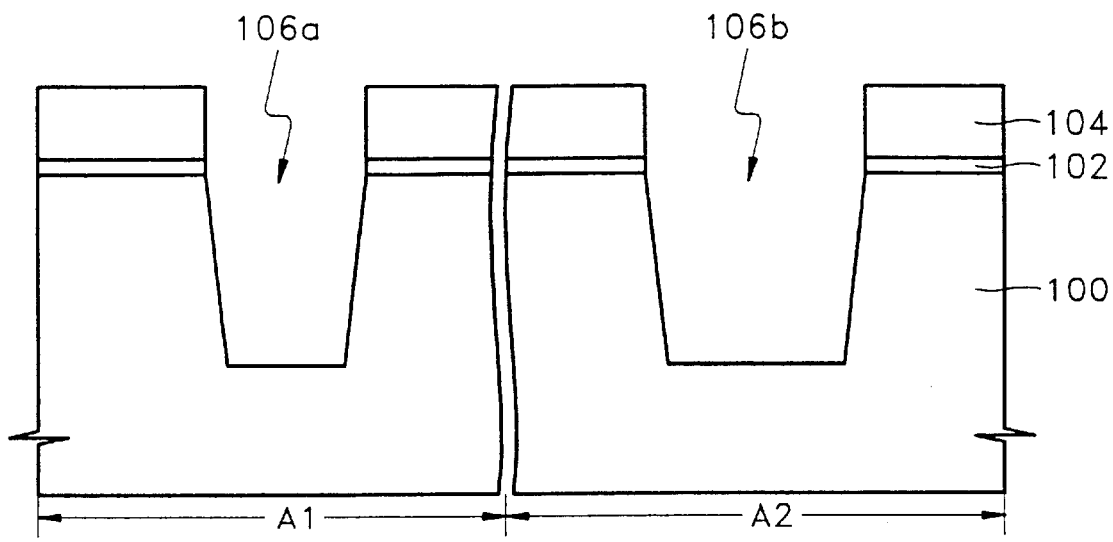
FIGS. 3A through 3E are cross-sectional views that illustrate integrated circuits and methods of forming integrated circuits having an STI structure according to embodiments the present invention.

Referring to FIG. 3A, a pad oxide layer 102 and a silicon nitride layer 104 are formed on a semiconductor substrate 100. The semiconductor substrate 100, which can be a silicon substrate containing impurities, is defined as having a cell region in which memory devices can be formed and core and peripheral regions in which PMOS transistors can be formed. According to FIG. 3A, A1 denotes the cell region and A2 denotes the core and peripheral regions.

In some embodiments according to the present invention, the pad oxide layer 102 is formed to a thickness in a range between about 70 and 160 Ångstroms and the silicon nitride layer 104 is formed in a range between about 1300 and 1600 Ångstroms. The silicon nitride layer 104 and the pad oxide layer 102 are etched using known photolithography processes, to expose a pre-isolation region of the semiconductor substrate 100 thereby forming a blocking pattern. Herein, "pre-isolation region" means a region for defining the cell, core and peripheral regions and the isolation structures formed in respective regions.

The first and second trenches 106a and 106b are formed by etching the semiconductor substrate 100 to a depth in a range between about 0.1 and 1.5 μm and preferably to a depth in a range between about 0.24 and 0.26 μm using the blocking pattern as a mask. The first and second trenches 106a and 106b are used to form Shallow Trench Isolation (STI) structures. The first trench 106a can provide isolation between devices formed in the cell region A1 and the second trench 106b can provide isolation between devices formed in the core and peripheral regions A2.

The first trench 106a is formed in the cell region A1 which may be densely populated with devices. Accordingly, the width of the first trench 106a may be less than the width of the second trench 106b that is formed in the core and peripheral regions A2. The first and second trenches 106a and 106b may be formed using dry etching in conjunction with a plasma. The dry etching may cause silicon lattice defects and damage to the surfaces of the first and second trenches 106a and 106b. For example, dry etching may cause the formation of sharp corners at the bottom of the side walls in the first and second trenches 106a and 106b.

Figure 3B:
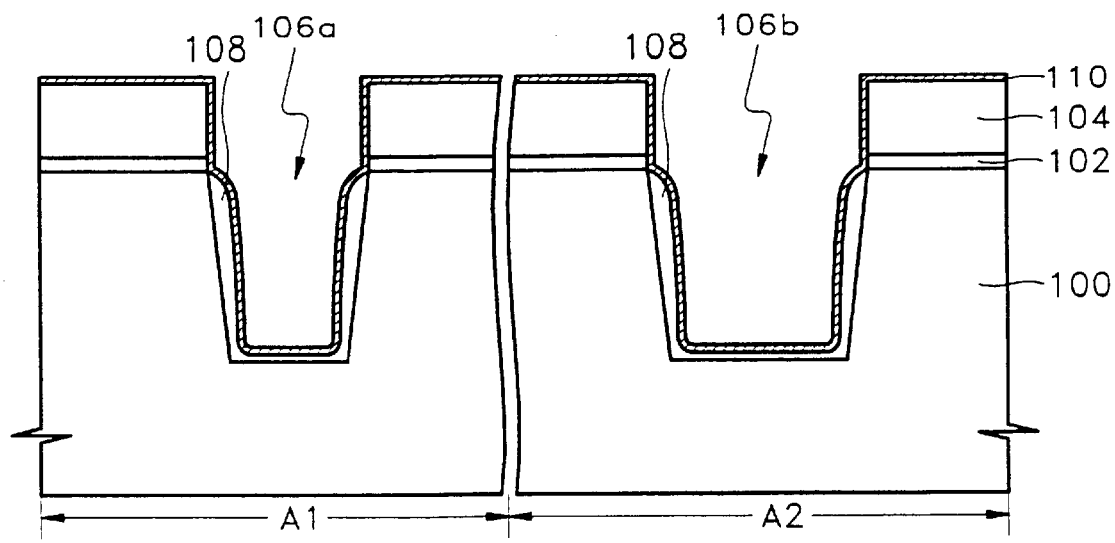

According to FIG. 3B, a side wall oxide layer 108 is formed in the first and second trenches 106a and 106b by thermally oxidizing the inner surfaces of the first and second trenches 106a and 106b. The side wall oxide layer 108 may address the silicon lattice defects and the damage to the first and second trenches 106a and 106b. For example, the side wall oxide layer 108 may smooth the sharp corners at the bottom of the side walls of the first and second trenches 106a and 106b. In some embodiments according to the present invention, the side wall oxide layer 108 is formed to a thickness in a range between about 20 and 240 Ångstroms and more preferably in a range between about 20 and 50 Ångstroms.

A relief liner 110 is formed on the sidewall oxide layer 108. The relief liner 110 may relieve a stress caused by a difference between the respective thermal expansion coefficients associated with the silicon semiconductor substrate 100 and a dielectric in the trenches 106a and 106b. The relief liner 110 may also reduce the penetration of defects into the first and second trenches 106a and 106b. In some embodiments according to the present invention, the relief liner 110 is a silicon nitride layer or a silicon oxynitride layer either of which can be formed to a thickness in a range between about of 50 and 100 Ångstroms.

Figure 3C:
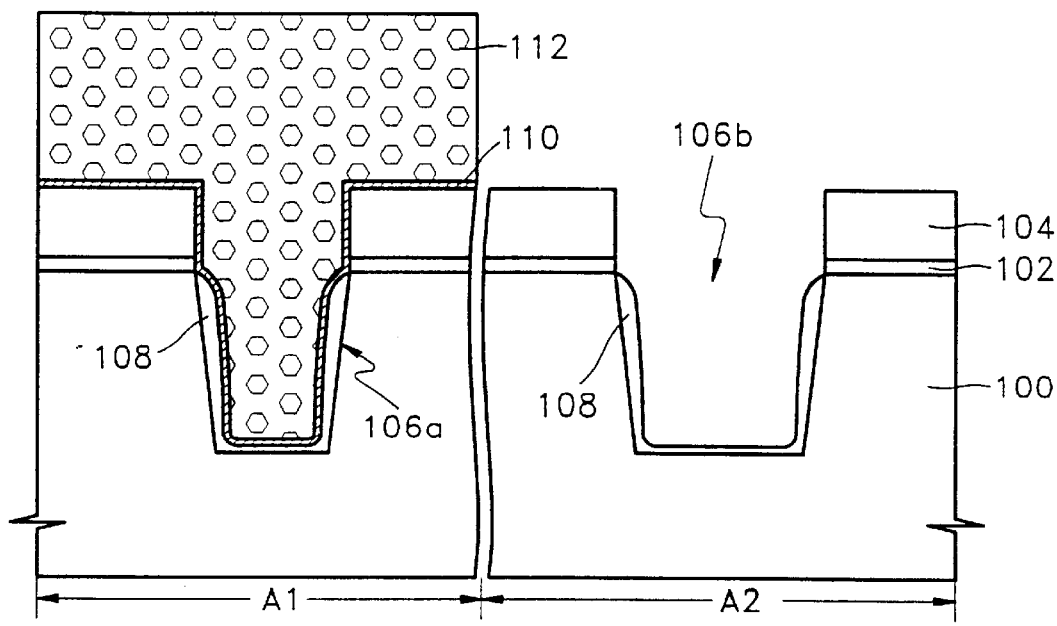

According to FIG. 3C, a photoresist pattern 112 is formed on the cell region using a known photolithography process. The core and peripheral regions A2 are exposed. The relief liner 110 on the core and peripheral regions A2 is removed so that the side wall oxide layer 108 is free of the relief liner 110 thereon. In some embodiments according to the present invention, it is preferable that the relief liner 110 is etched using isotropic etching. In some embodiments according to the present invention, the isotropic etching is a wet etching using a phosphoric acid solution or a dry etching using an isotropic gas.

Figure 3D:
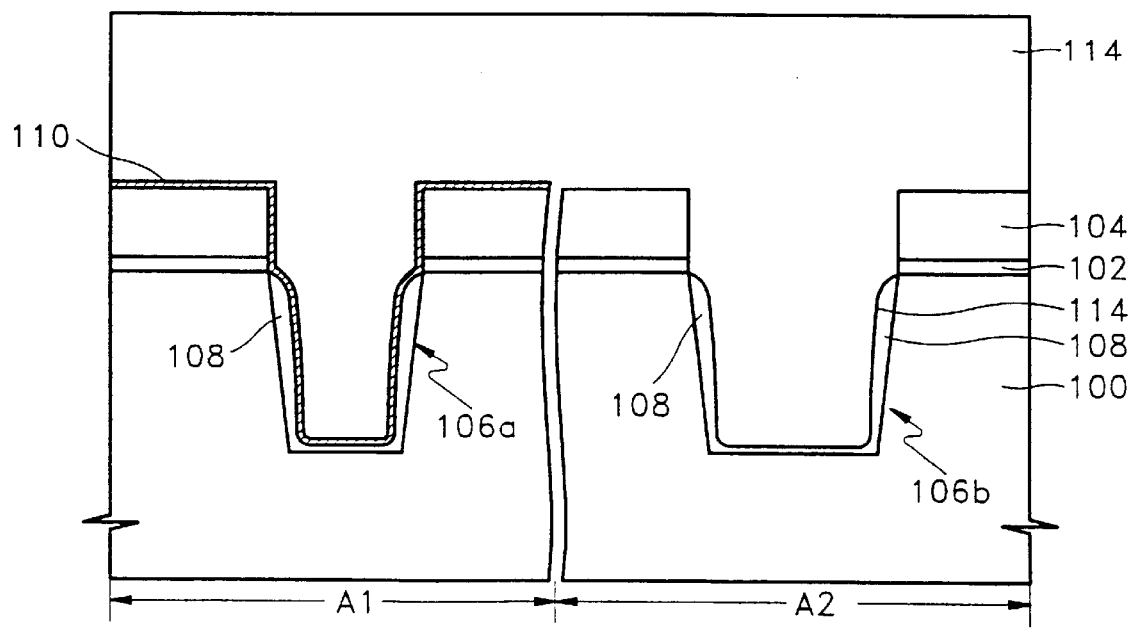

According to FIG. 3D, the photoresist pattern 112 is removed by a known method. A dielectric layer 114 is formed on the resultant semiconductor substrate 100 to a thickness of more than about 6000 Ångstroms to fill the first and second trenches 106a and 106b. In some embodiments according to the present invention, the dielectric layer 114 is a HDP dielectric layer having good filling properties. The dielectric layer 114 is densified to reduce the upper part of the dielectric layer 114 in the trenches 106a and 106b lost during a subsequent CMP process. In some embodiments according to the present invention, the densification process is performed at a temperature higher than about 900° C.

Figure 3E:
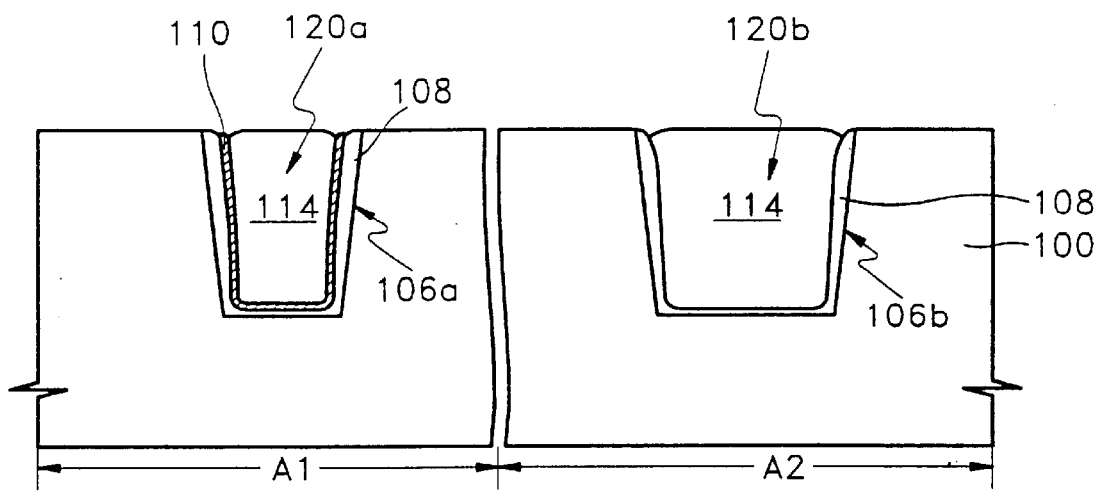

According to FIG. 3E, a CMP process is performed on the dielectric layer 114, the relief liner 110, the silicon nitride layer 104, and the pad oxide layer 102 until the surface of the semiconductor substrate 100 is exposed, thereby providing the first and second STI structures 120a and 120b.

According to the present embodiment, the relief liner 110 of the second STI structure 120b in the core and peripheral regions A2 is removed. As a result, an amount of negative charges trapped at the inner edge of the second STI structure 120b can be reduced thereby reducing the positive charges induced at the outer edge of the second STI structure 120b. As a result, a leakage current path may not be generated between adjacent p-type doped regions 204 of adjacent PMOS transistors.

The region and size of the second STI structure 120b in the core and peripheral regions A2 may be larger than the first STI layer 120a in the cell region. Consequently, less stress may be caused by a difference in respective thermal expansion coefficients associated with the substrate and a silicon oxide layer in the trench even though a thermal process is performed. Therefore, although the second STI structure 120b is free of the relief liner 110, the stress on the second STI layer 120b may be reduced during the thermal process.

In further embodiments according to the present invention, the second STI structure 120b is formed only between PMOS transistors in the core and peripheral regions. In addition, the first STI structure 120a (having the relief liner 110 included) is formed in the cell region as well as in a region for providing isolation in areas that are not between PMOS transistors in the core and peripheral regions.

Figure 4:
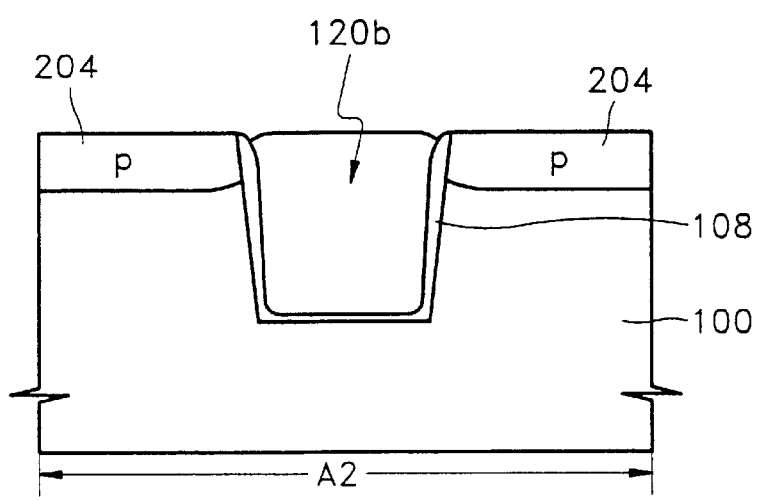
FIGS. 4 through 6 are cross-sectional views that illustrates integrated circuits and methods of forming integrated circuits having STI structures according to embodiments of the present invention.
Figure 5:
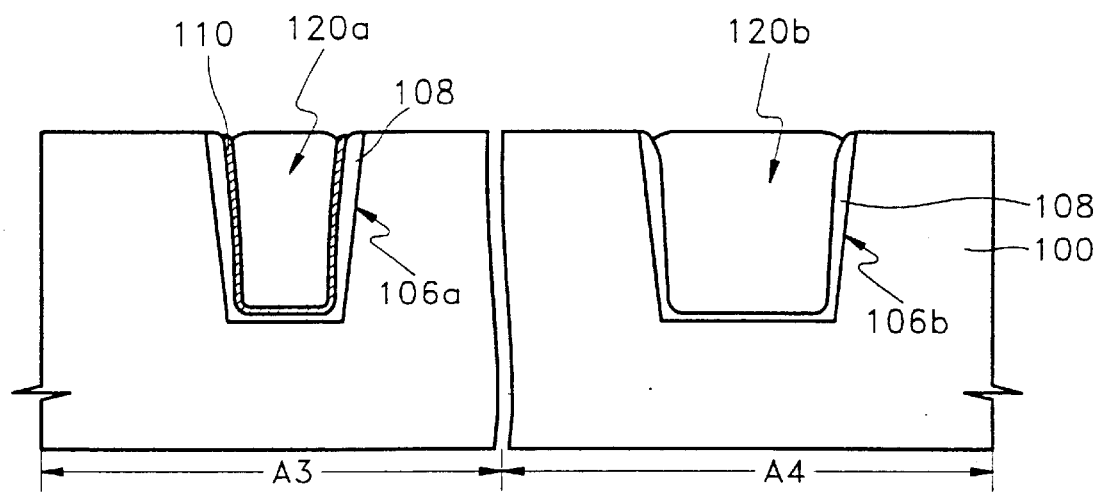

In these further embodiments according to the present invention, the manufacturing method is substantially the same as that disclosed above in reference to FIGS. 3A to 4, except that the photoresist pattern 112 for removing the relief liner 110 is formed to define trenches only between adjacent PMOS transistors. The other steps may be the same as those disclosed above. According to FIG. 5, reference numeral A3 denotes a region where circuits other than PMOS transistors are formed in the cell region, the core region and the peripheral region. Reference numeral A4 denotes a region having PMOS transistors formed therein.

Figure 6:
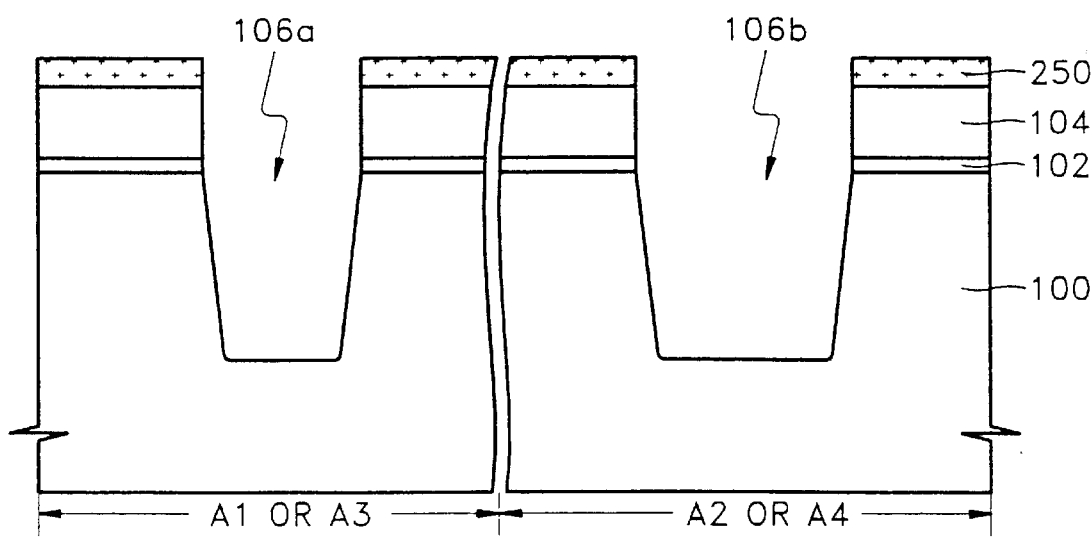

In some embodiments according to the present invention, as illustrated in FIG. 6, the pad oxide layer 102 and the silicon nitride layer 104 are formed on the semiconductor substrate 100. An anti-reflection film 250 is formed on the silicon nitride layer 104 to reduce reflection from the silicon nitride layer 104 during a subsequent photolithography process. In some embodiments according to the present invention, the anti-reflection film 250 is a silicon oxynitride (SiON) layer formed to a thickness in a range between about 600 and 700 Ångstroms.

The anti-reflection film 250, the silicon nitride layer 104, and the pad oxide layer 102 are etched using a known photolithography process to expose a pre-isolation region of the semiconductor substrate 100. The semiconductor substrate 100 is etched to a depth in a range between about 0.1 to 1.5 μm using the silicon nitride layer 104 as a mask, to thereby form the first and second trenches 106a and 106b. The first trench 106a is formed in the cell region A1 or in the region A3 except for those portions within A3 that provide isolation between PMOS transistors. The second trench 106b is formed in the core and peripheral regions A2 or the region A4 for providing isolation between adjacent PMOS transistors in the core and the peripheral regions. Forming the anti-reflection film 250 on the silicon nitride layer 104 may prevent a notching phenomenon in the photolithography process.

As disclosed above, in embodiments according to the present invention, the STI structures that provide isolation between the core and peripheral regions or between PMOS transistors in the core and peripheral regions, are formed free of the relief liner. The amount of negative charges trapped or remaining at the inner boundary of the STI structure can be reduced which may reduce the amount of positive charges induced at the outer boundary of the STI layer. As a result, a current path may not be created between the adjacent p-type doped regions of adjacent PMOS transistors and the threshold and breakdown voltages associated with the PMOS transistor can be protected. In contrast, STI structures formed in the cell region and between adjacent n-type doped regions include the relief layer.

In the drawings and specification, there have been disclosed embodiments of the invention and, although specific terms are employed, they are used in a generic and descriptive sense only and not for purposes of limitation, the scope of the invention being set forth in the following claims.

What is claimed:

1. A method of forming an integrated circuit comprising:
   forming a first trench in one of a core region and a peripheral region of an integrated circuit substrate;
   forming a second trench in a cell region of the integrated circuit that is adjacent to the core and peripheral regions, the second trench being narrower than the first trench;
   forming an insulator layer in the first and second trenches;
   forming a liner layer on the insulator layer in the first and second trenches;
   forming a mask on the second trench that exposes the first trench; and
   removing the liner layer from the first trench and avoiding removing the liner layer from the second trench to reduce a stress between the integrated circuit substrate and the insulator layer in the second trench.

2. A method according to claim 1 wherein forming a first trench is preceded by:

forming an anti-reflection layer on the integrated circuit substrate.

3. A method according to claim 1 wherein forming a first trench comprises forming a first trench in one of the peripheral and core regions between first and second adjacent p-type doped regions spaced-apart from one another in the integrated circuit substrate.

4. A method according to claim 3 wherein the mask exposes portions of the integrated circuit in which Positive Metal-Oxide-Semiconductor (PMOS) regions are formed.

5. A method according to claim 3 wherein forming the first trench comprises forming the first trench to a depth in a range between about 0.1 and 1.5 μm.

6. A method according to claim 3 wherein forming a liner layer comprises forming one of a silicon nitride layer and a oxynitride layer having a thickness in a range between about 50 and 100 Å.

7. A method of manufacturing a semiconductor device having an STI structure, comprising:

providing a semiconductor substrate defined as a cell region in which memory devices are formed and core and peripheral regions in which a PMOS transistor is formed;

forming a blocking pattern on the semiconductor substrate to expose a predetermined region for defining the cell, core and peripheral regions of the semiconductor substrate and providing isolation between devices in respective regions;

forming a plurality of trenches by etching exposed regions of the semiconductor substrate to a predetermined depth using the blocking pattern as a mask;

forming a side wall oxide layer on inner surfaces of the plurality of trenches;

forming a plurality of relief liners in the plurality of trenches on the side wall oxide layers therein;

removing the relief liner from a selected one of the plurality of trenches between PMOS transistors;

depositing a dielectric material to completely fill the plurality of the trenches; and forming an STI layer by chemically and mechanically polishing the dielectric material, the relief liner, and the blocking pattern.

8. A method according to claim 7 wherein the side wall oxide layer is formed by thermally oxidizing the semiconductor substrate.

9. A method according to claim 7 wherein the relief liner comprises a silicon nitride layer or a silicon oxynitride layer.

10. A method according to claim 7 wherein the relief liner of the selected region is removed by an isotropic etching.

11. A method according to claim 7 wherein the selected region includes a trench between PMOS transistors in the core and peripheral regions.

12. A method according to of claim 7 wherein the selected region includes the core and peripheral regions.

13. A method according to claim 7 further comprising:

densifying the dielectric material between depositing the dielectric material and chemically and mechanically polishing the dielectric material, the relief liner, and the blocking pattern.

14. A method according to claim 13 wherein the dielectric material is densified by thermally treating the dielectric material at a temperature greater than about 900° C.

15. A method according to claim 7 wherein forming the blocking pattern comprises:

forming a pad oxide layer on the semiconductor substrate;

forming a silicon nitride layer on the pad oxide layer; and patterning the silicon nitride layer and the pad oxide layer to expose the predetermined region.

16. A method according to claim 15 further comprising:

forming an anti-reflection film on the silicon nitride layer between forming the silicon nitride layer and patterning to expose the predetermined region, wherein the anti-reflection film is patterned to expose the predetermined region in patterning to expose the predetermined region.

17. A method of forming an integrated circuit in an integrated circuit device comprising:

forming a liner layer on side walls of first isolation trenches located in a cell region of an integrated circuit substrate to provide stress relief between a dielectric in the first isolation trenches and the substrate; and avoiding forming the liner layer on side walls of second isolation trenches located in a peripheral region of the substrate.

18. A method according to claim 17 wherein the first isolation trenches are narrower than the second isolation trenches.

19. A method according to claim 17 wherein avoiding forming the liner layer on the side walls of the second isolation trenches comprises:

forming a mask on the substrate that covers the first isolation trenches and that exposes the second isolation trenches; and removing the liner layer from the second isolation trench through the mask.

20. A method according to claim 19 wherein the mask exposes portions of the substrate in which Positive Metal-Oxide-Semiconductor (PMOS) regions are formed.

21. A method according to claim 17 wherein forming the first isolation trenches comprises forming the first isolation trenches to a depth in a range between about 0.1 μm and 1.5 μm.

22. A method according to claim 17 wherein forming the liner layer comprises forming one of a silicon nitride layer and a oxynitride layer having a thickness in a range between about 50 Å and about 100 Å.

* * * * *